(12) United States Patent
Hare et al.

(10) Patent No.: US 6,426,712 B1
(45) Date of Patent: Jul. 30, 2002

(54) FAULT-SIGNAL GENERATORS AND METHODS FOR RESOLVER SYSTEMS

(75) Inventors: Bruce Hare, Shrewsbury; Aengus Murray, Newton, both of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/714,377

(22) Filed: Nov. 16, 2000

(51) Int. Cl.$^7$ ................................................ H03M 1/48
(52) U.S. Cl. ................. 341/116; 324/76.11; 324/76.52; 324/76.77; 340/68
(58) Field of Search ............................. 341/116, 116.8; 340/658; 324/76.11, 76.52, 76.77

(56) References Cited

U.S. PATENT DOCUMENTS

| | | | |
|---|---|---|---|
| 3,641,565 A | * 2/1972 | Ivers et al. ................... 341/116 |
| 3,984,831 A | * 10/1976 | Jones et al. .................. 341/116 |
| 4,079,374 A | * 3/1978 | Cox, Jr. ....................... 341/116 |
| 4,449,117 A | * 5/1984 | Fortescue .................... 318/660 |
| 5,162,798 A | 11/1992 | Yundt .......................... 341/116 |
| 5,218,298 A | 6/1993 | Vig |
| 5,260,650 A | * 11/1993 | Schwesig et al. ............ 324/163 |
| 5,321,635 A | * 6/1994 | Sears et al. ..................... 361/18 |
| 5,347,277 A | 9/1994 | Nondahl et al. ............. 341/116 |
| 5,451,945 A | 9/1995 | Alhorn et al. ............... 341/110 |
| 5,684,719 A | 11/1997 | Anagnost ..................... 364/559 |
| 5,796,357 A | * 8/1998 | Kushihara .................... 341/116 |
| 5,832,413 A | * 11/1998 | Benco et al. ............. 324/76.28 |
| 5,912,638 A | 6/1999 | Vlahu ........................... 341/116 |

FOREIGN PATENT DOCUMENTS

JP     8289521     4/1995

* cited by examiner

*Primary Examiner*—Michael Tokar
*Assistant Examiner*—Linh Van Nguyen
(74) *Attorney, Agent, or Firm*—Koppel, Jacobs, Patrick & Heybl

(57) ABSTRACT

Resolver systems are described that generate an estimate $\phi$ of a rotatable member's position angle $\theta$ and provide fault signals which monitor the reliability and accuracy of the estimate. The fault signals are formed from a monitor signal which multiplies resolver and estimate signals to derive information on the absolute and relative levels of resolver sense signals. At least one fault signal is formed from a loop error signal of the system servo loop. The fault signals report on, for example, mismatched sense signals, out-of-range sense signals and loss of position tracking to thereby enhance accuracy and safety in various resolver applications.

24 Claims, 9 Drawing Sheets

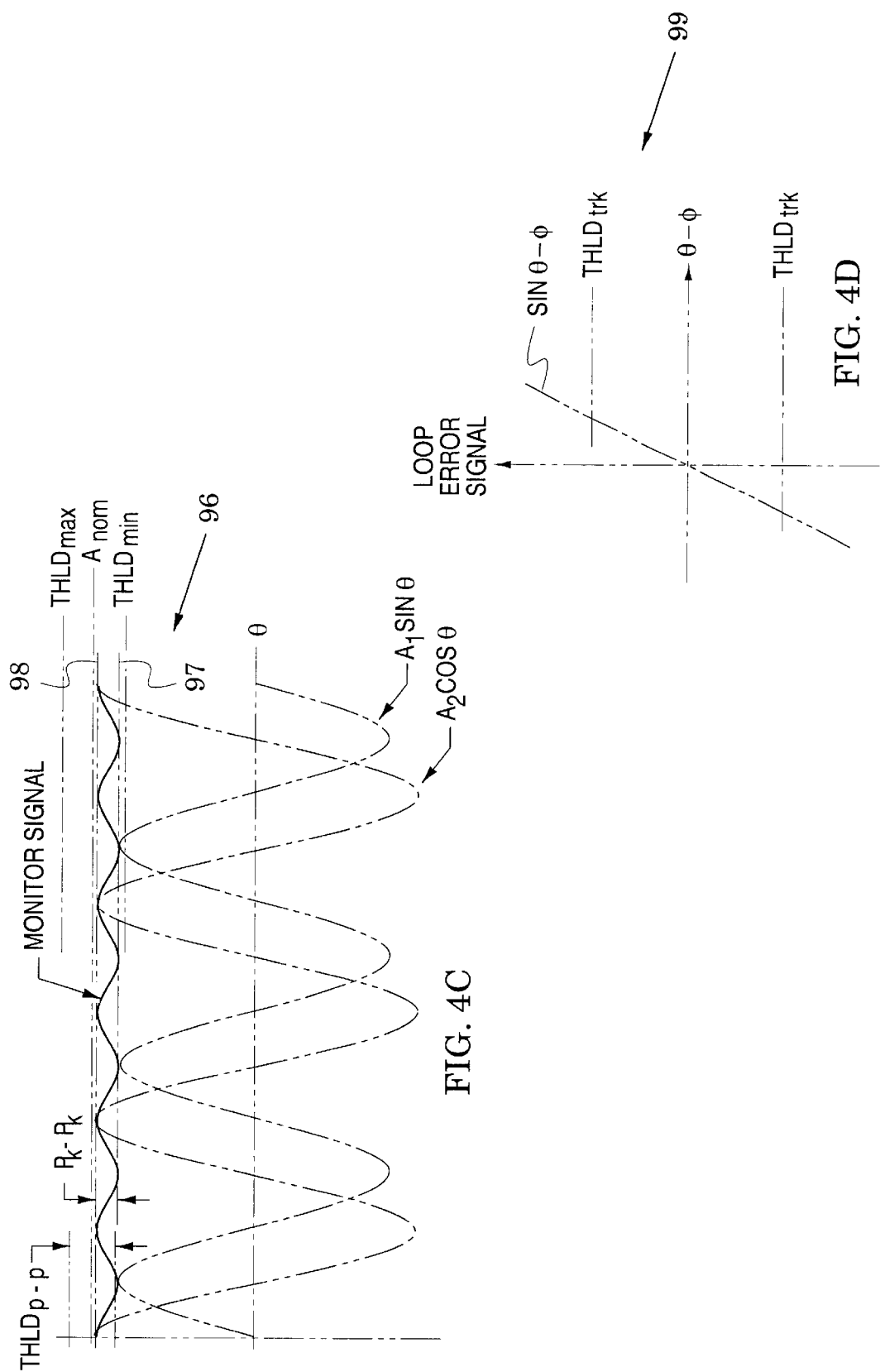

FAULT-SIGNAL GENERATORS AND METHODS FOR RESOLVER SYSTEMS

BACKGROUND OF THE INVENTION

1. Field of the Invention

The present invention relates generally to resolver systems and, more particularly, to resolver-to-digital converters (RDCs) for these systems.

2. Description of the Related Art

FIG. 1 illustrates a conventional resolver system 20 that includes a resolver 22 and an RDC 24. The resolver 22 has a rotor 26 that rotates in a stator 28 and is coupled to a rotatable member 30 whose angular position is defined by an angle θ. A rotor winding 32 is carried on the rotor 26 and is excited by a carrier signal 34 (typically a sinusoid having a frequency that is generally in the range of 2–20 KHz) from a carrier signal generator 36. In addition, first and second stator windings 40 and 42 are carried on the stator 28.

In response to the carrier signal 34 in the rotor winding 32, sense signals are magnetically coupled into the stator windings 40 and 42 as they rotate with the rotatable member 30. The amplitudes of the sense signals change as the relationships between the stator windings and the rotor winding change with variations in the angle θ. The stator windings 40 and 42 are electrically offset from each other by an offset angle. This offset angle is typically 90° so that the sense signals are generally in quadrature.

In a quadrature relationship, the rotor windings 40 and 42 provide sense signals $A_1 \sin \theta$ and $A_2 \cos \theta$ to the RDC 24 wherein the sense signals are modulated onto the carrier signal 34. The RDC 24 receives the sense signals $A_1 \sin \theta$ and $A_2 \cos \theta$ and the carrier signal 34 and generates a digital estimate φ of the angle θ of the rotatable member 30. Typically, RDCs also provide an analog estimate φ of the velocity of the rotatable member 30.

Resolver systems are used in a variety of applications (e.g., automotive motion sensing and control, automotive motor control, industrial and servo motor control, encoder emulation and factory automation) for providing an estimate φ of a position angle θ of rotatable members (e.g., vehicle steering wheels, aircraft control structures, robot arms, gyroscope members, machine tools and scanned antennas) over a wide range of member velocities (e.g., 0–1 Khz).

In these applications, the resolver 22 of FIG. 1 may be located at a substantial distance from the RDC 24 and, accordingly, the sense signals $A_1 \sin \theta$ and $A_2 \cos \theta$ are typically coupled through transmission lines (e.g. twisted pairs) 44. However, the length, position, environment (e.g., vibration) and physical state (e.g., worn or crimped) of the cables or the physical state of the resolver (e.g., inoperative) may cause the sense amplitudes $A_1$ and $A_2$ to vary significantly from their nominal value $A_{nom}$ (or, in the extreme, cause a complete loss of sense signals). If the variation is excessive, the accuracy of the digital estimate φ may be degraded to a level at which it should not be relied on by circuits or systems that receive it.

It has been proposed, for example, that the orientation of a vehicle's front wheels be controlled in response to a resolver system that provides an estimate φ of the angle θ of the vehicle's steering wheel. If the accuracy of the estimate φ has been degraded for any reason, it is imperative for safety that the coupling between the steering wheel position and the steering actuator be immediately replaced with a backup system.

It is desirable, therefore, that a resolver system include a reliable fault detection system that can provide meaningful fault signals $S_{fault}$ (provided from the RDC 24 in FIG. 1). Although some conventional resolver systems have included fault detection systems, their performance parameters (e.g., sensitivity, accuracy and response time) have typically lacked the ability to detect out-of-specification conditions and this ability is critical in many modern applications of resolver systems.

SUMMARY OF THE INVENTION

The present invention is directed to resolver systems that generate an estimate φ of a rotatable member's position angle θ and provide fault signals which monitor the reliability and accuracy of the estimate.

Fault signals of the invention are derived from a monitor signal which multiplies resolver and estimate signals to derive information on the absolute and relative levels of resolver sense signals. At least one fault signal is derived from a loop error signal of the system servo loop. These fault signals report on, for example, mismatched sense signals, out-of-range sense signals and loss of position tracking to thereby enhance accuracy and safety in various resolver applications.

The novel features of the invention are set forth with particularity in the appended claims. The invention will be best understood from the following description when read in conjunction with the accompanying drawings.

BRIEF DESCRIPTION OF THE DRAWINGS

FIGS. 4B and 4C are graphs that show the sense signals of FIG. 4A as they differ from a nominal amplitude and that show a tracking signal which indicates that difference;

FIG. 4D is a graph of a loop error signal in the resolver system of FIG. 2;

DETAILED DESCRIPTION OF THE PREFERRED EMBODIMENTS

Figure 1:
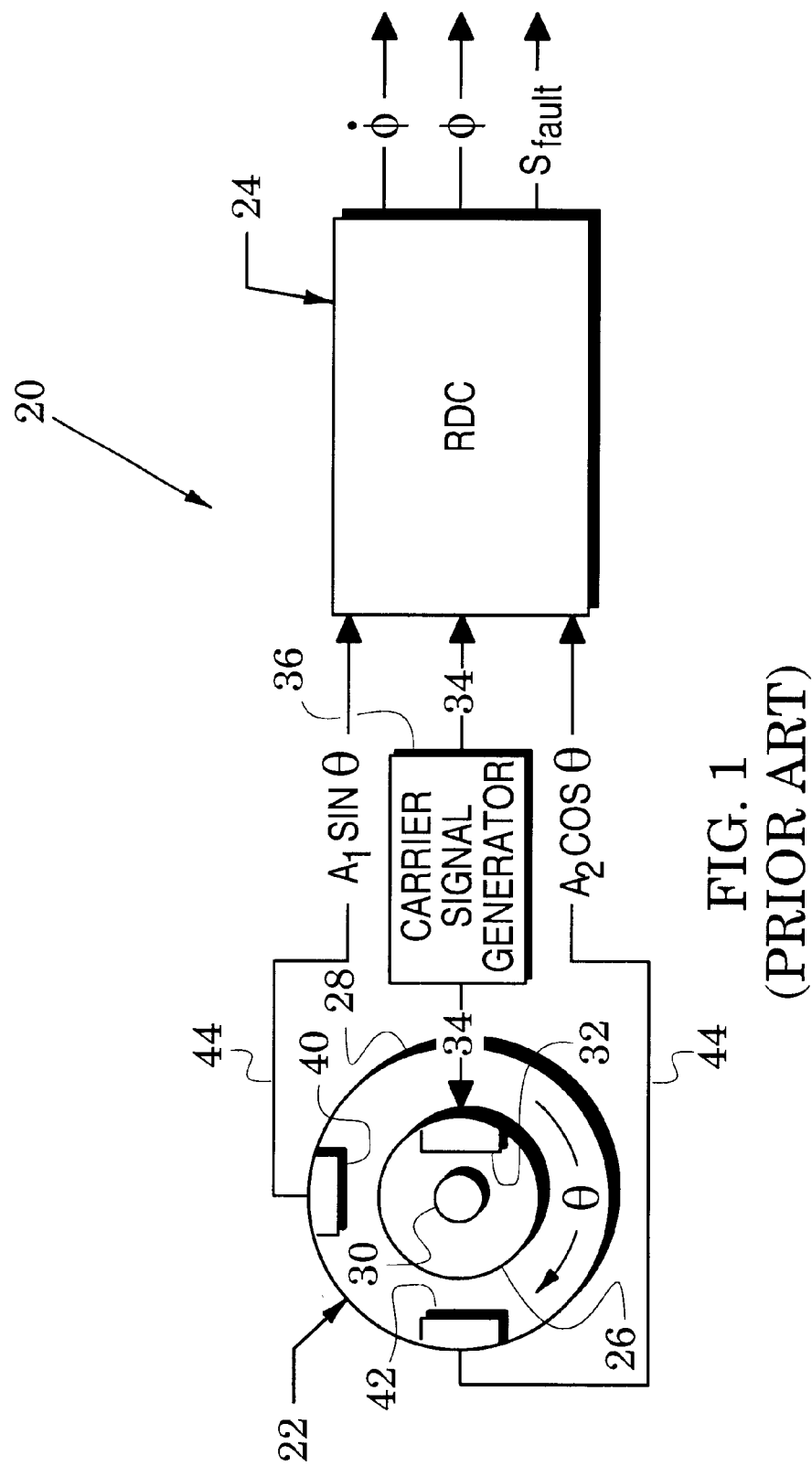
FIG. 1 is a block diagram of a conventional resolver system.
Figure 2:
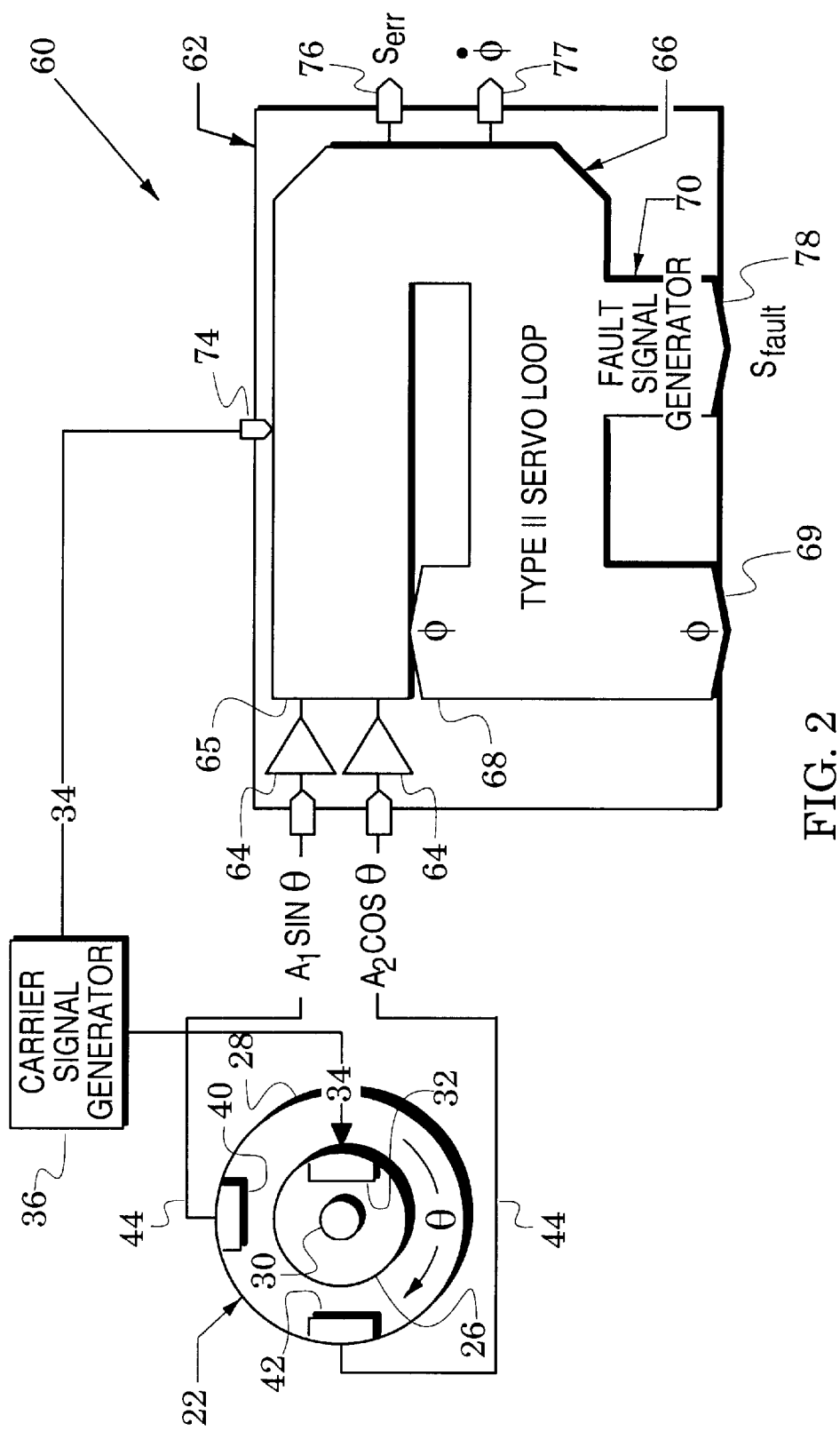
FIG. 2 is a block diagram of a resolver system of the present invention.

FIG. 2 illustrates a resolver system 60 that provides an estimate φ of a position angle θ of a rotatable member and also provides fault signals that monitor the accuracy and reliability of the estimate φ. In particular, the system 60 couples the resolver 22 and the carrier signal generator 36 of FIG. 1 to an RDC 62. The resolver 22 generates sense signals $A_1 \sin \theta$ and $A_2 \cos \theta$ which are received through buffers 64 into the input 65 of a type II servo loop 66 of the RDC 62.

In response to the sense signals, the servo loop 66 generates an estimate φ (of the position angle θ) and this estimate is compared to the sense signals at a φ return port 68 and is also provided externally at an output port 69. The carrier signal 34 is provided to the servo loop 66 at an input port 74 and the servo loop provides a loop error signal $S_{err}$ and a velocity signal at an error port 76 and a velocity port 77.

Figure 3:
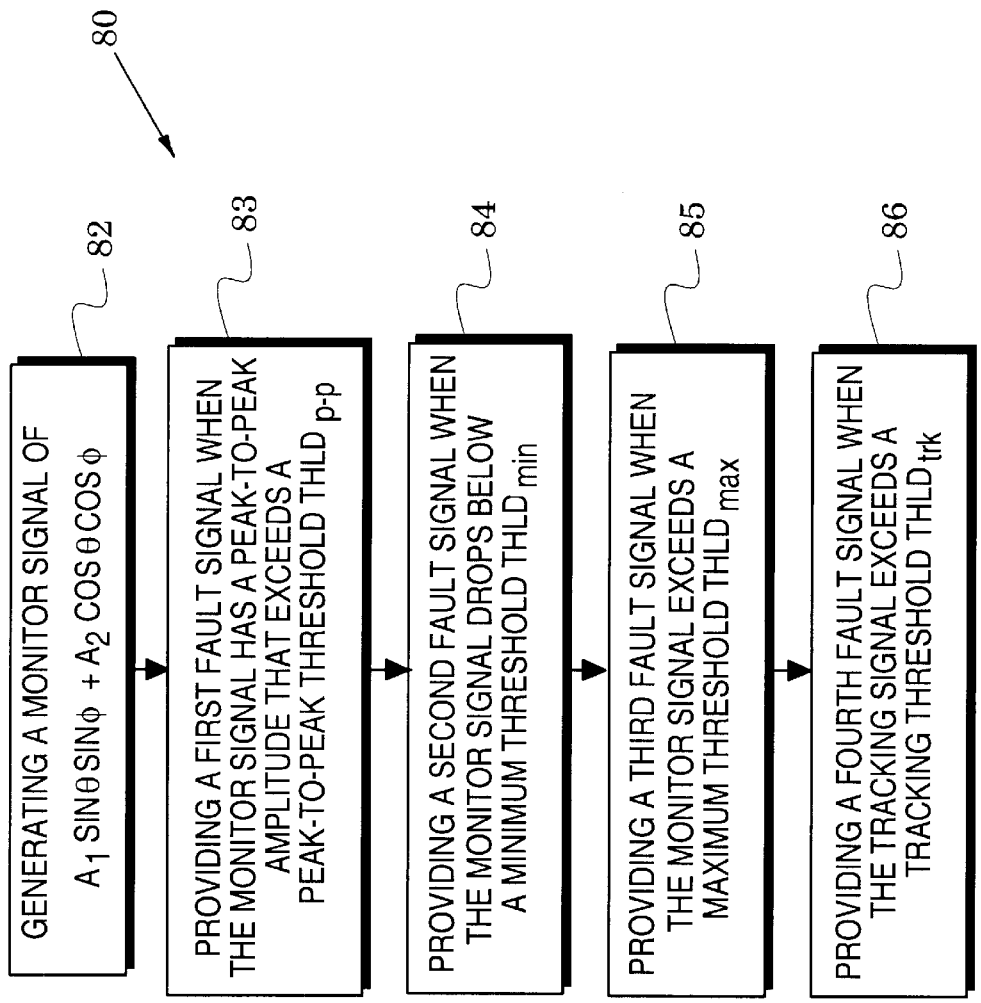
FIG. 3 is a flow diagram that illustrates fault-signal processes in the resolver system of FIG. 2.
Figure 4A:
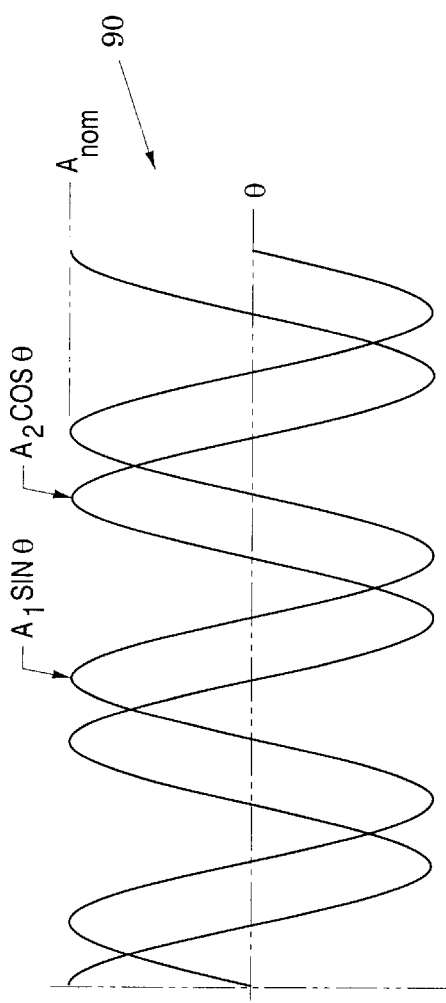
FIG. 4A is a graph of sense signals in the resolver system of FIG. 2.
Figure 4B:
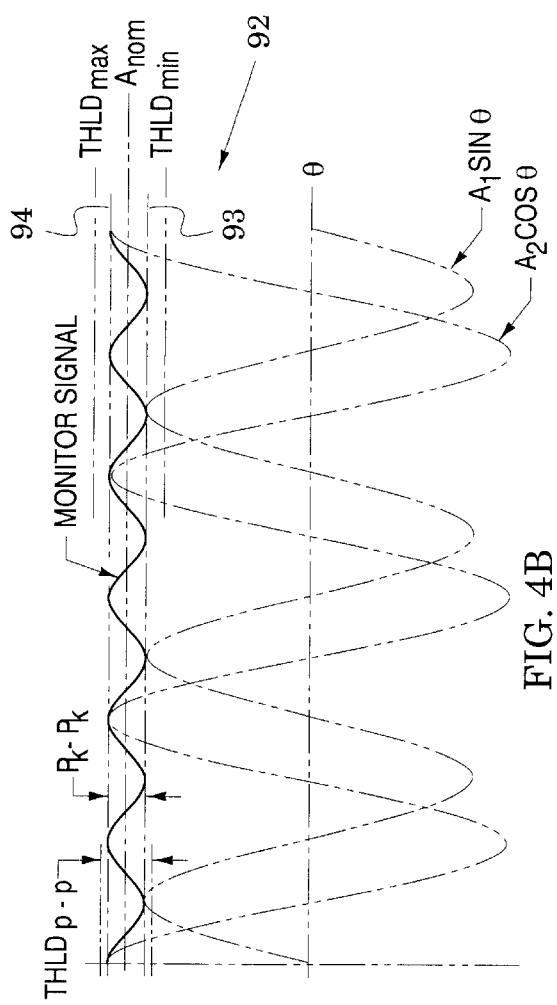
Figure 6:
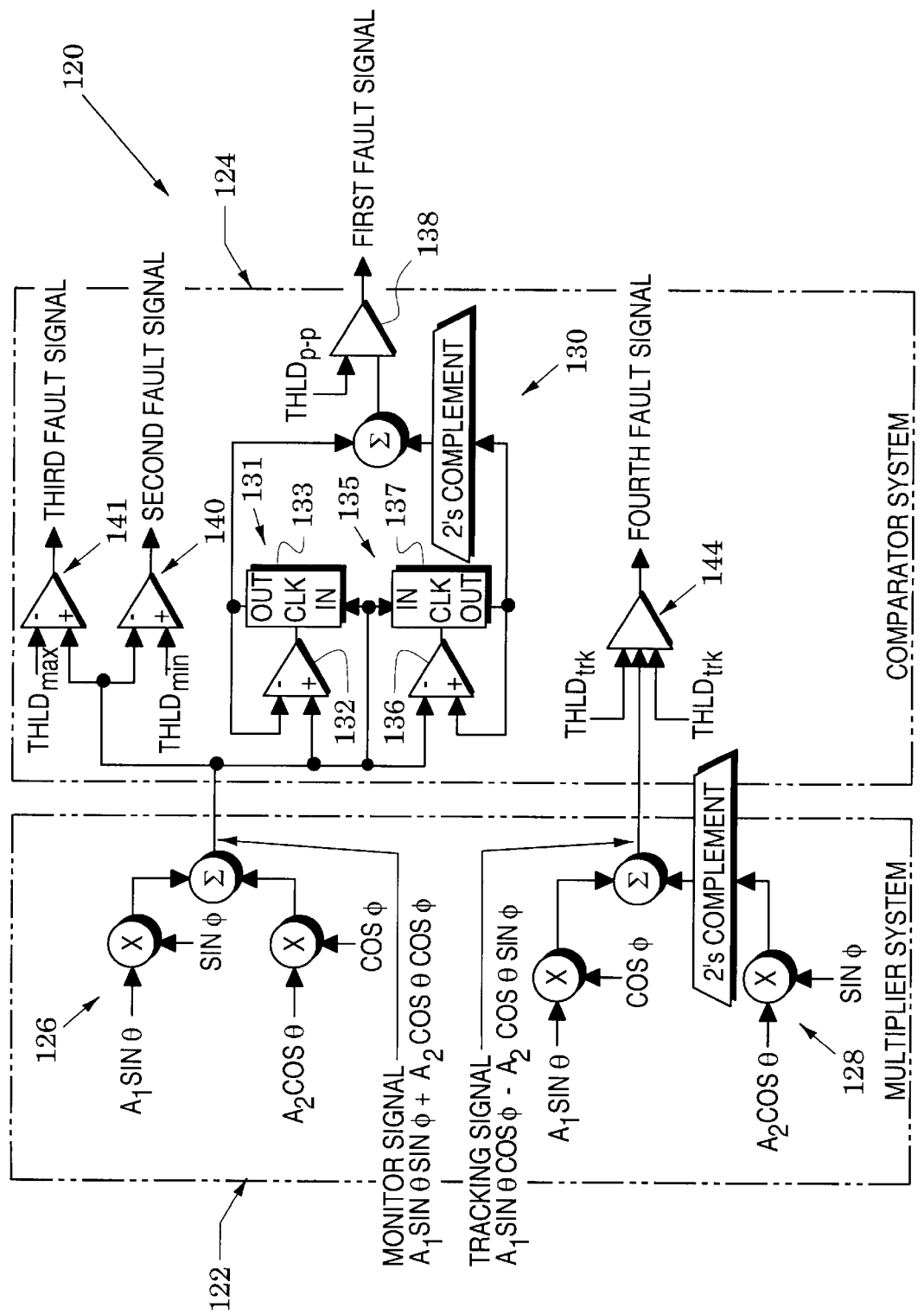
FIG. 6 is a network diagram of a fault-signal generator embodiment in the resolver system of FIG. 2.

A fault-signal generator 70 is coupled to signals of the servo loop 66 and is configured to provide fault signals $S_{fault}$ at a fault port 78. Fault signals are obtained from the loop error signal and with the aid of a monitor signal that is formed as a product of the sense and estimate signals. The tracking signal and its relationship to the sense signals are illustrated in FIGS. 4A–4C and the loop error signal is shown in FIG. 4D. In addition, FIG. 3 illustrates process steps in the fault-signal generator 70 of FIG. 2 and FIG. 6 illustrates multiplier and comparator system embodiments for the fault-signal generator. Descriptions of these signals, processes and embodiments are enhanced by preceding them with the following investigation of the servo loop 66.

The servo loop generates the estimate φ which essentially tracks the sense signals $A_1 \sin θ$ and $A_2 \cos θ$. In particular, the estimate and the sense signals are multiplied and products summed to provide a tracking signal that includes a term $\sin θ \cos φ - \cos θ \sin φ$. By trigonometric identity, this term can be replaced by $\sin(θ-φ)$ which, for small values of θ-φ, is simply approximated by θ-φ. Thus, when φ is close to θ, the tracking signal produces an error signal $S_{err}$ which is substantially θ-φ. The carrier content of this loop error signal is removed by demodulating it with a sample of the carrier signal 34 which is provided to the servo loop at the input port 74. If desired, the demodulated loop error signal φ $S_{err}$ may be provided at an output port 78.

In a type II servo loop, the error signal $S_{err}$ is integrated twice. The first integration produces a term which is essentially the velocity signal at the velocity port 77. The second integration (i.e., an integration of the velocity) produces the estimate φ of the angle θ and this estimate is provided at the return port 68 and the output port 69 of the servo loop 66. For a constant rotational velocity (of the rotatable member 30), the second integration maintains a constant nonzero output. This requires that the input to the second integration (i.e., the loop error signal $S_{err}$) be zero so that φ=θ. During acceleration or deceleration, the estimate φ must change accordingly which requires that the the input to the second integration has a nonzero value.

Thus the servo loop 66 effectively generates an estimate φ of the angle θ of the rotatable member 30. The accuracy of the servo loop is, however, degraded if either or both of the amplitudes $A_1$ and $A_2$ of the sense signals $A_1 \sin θ$ and $A_2 \cos θ$ are substantially different from their nominal value $A_{nom}$ (e.g., in the case of defective transmission lines (44 in FIG. 2) or are missing altogether (e.g., in the case of a broken transmission line or a defective resolver). Accordingly, the fault-signal generator 70 monitors the amplitudes $A_1$ and $A_2$ and generates fault signals that indicate the state of the amplitudes.

Process steps of the fault-signal generator 70 are shown in the flow diagram 80 of FIG. 3. In a first process step 82, a monitor signal of $A_{sin} θ \sin φ + A_2 \cos θ \cos φ$ is generated. Process step 83 states that a first fault signal is generated in the event the peak-to-peak amplitude of the monitor signal exceeds a predetermined peak-to-peak threshold $THLD_{p-p}$. Process steps 84 and 85 state that a second fault signal is then generated in the event the monitor signal exceeds a predetermined maximum threshold $THLD_{max}$ that is greater than the nominal value $A_{nom}$ and a third fault signal is generated in the event the monitor signal drops below a predetermined minimum threshold $THLD_{min}$ that is less than the nominal value $A_{nom}$. If φ=θ, it is observed that the monitor signal $A_1 \sin θ \sin φ + A_2 \cos θ \cos φ$ of process step 82 reduces to $$\frac{1}{2}(A_1 + A_2) + \frac{1}{2}(A_1 - A_2)\cos 2θ \qquad (1)$$

by use of the trigonometric identities $\sin^2 θ = ½(1 - \cos 2θ)$ and $\cos^2 θ = ½(1 + \cos 2θ)$.

Equation (1) is best understood by referring to FIGS. 4A and 4B. FIG. 4A is a graph 90 that shows the sense signals $A_1 \sin θ$ and $A_2 \cos θ$ for a case in which $A_1 = A_2 = A_{nom}$. In the graph 92 of FIG. 4B, $A_1$ has decreased below $A_{nom}$ (to a level indicated by the broken line 93) and $A_2$ has increased by a like amount above $A_{nom}$ (to a level indicated by the broken line 94). Equation (1) shows that the monitor signal is a cosine function at a rate of 2θ, the function has a peak amplitude of ½ the difference between $A_1$ and $A_2$, and the function is displaced upward by ½ of the sum of $A_1$ and $A_2$. As shown in the graph 92 of FIG. 4B, therefore, the monitor signal has twice the rate of the sense signals and fills the region between the broken lines 93 and 94.

Therefore, the upper peak of the monitor signal 95 monitors the greater of $A_1$ and $A_2$, the lower peak monitors the lesser of $A_1$ and $A_2$ and the peak-to-peak amplitude of the monitor signal monitors the difference between $A_1$ and $A_2$. Knowledge of the operation of the resolver system 60 of FIG. 2 (e.g., as ascertained by analysis and testing) is used to establish the predetermined operational thresholds of the sense signals that will assure operational accuracy. Thus, FIG. 4B indicates a maximum threshold $THLD_{max}$ and a minimum threshold $THLD_{min}$ for $A_1$ and $A_2$. FIG. 4B also indicates a peak-to-peak threshold $THLD_{p-p}$ for the difference between $A_1$ and $A_2$ that will assure operational reliability and accuracy.

It is noted that the monitor signal of FIG. 4B indicates that $A_1$ and $A_2$ are well within the maximum and minimum thresholds but that a slight increase in the difference between $A_1$ and $A_2$ will cause the peak-to-peak value of the monitor signal to exceed the peak-to-peak threshold. The form of the corresponding first fault signal (in process step 83 of FIG. 3) can be configured in various ways when practicing the invention. For example, it may be configured to go true during each cycle of the monitor signal when the decrease of the monitor signal from its peak value exceeds the magnitude of the peak-to-peak threshold. As a second example, it may be configured to go true for all cycles in which the peak-to-peak value of the monitor signal exceeds the peak-to-peak threshold.

In the graph 96 of FIG. 4C, $A_1$ has decreased further below $A_{nom}$ (to a level indicated by the broken line 97) and $A_2$ has decreased slightly below $A_{nom}$ (to a level indicated by the broken line 98). In this case, it is noted that the monitor signal indicates that $A_1$ and $A_2$ are well within the peak-to-peak threshold (shown centered about $A_{nom}$) but that a slight further decrease of $A_1$ will cause the monitor signal to drop below the minimum threshold.

The form of the corresponding second fault signal (in process step 84 of FIG. 3) can also be configured in various ways when practicing the invention. For example, it may be configured to go true for the time of each cycle during which the monitor signal is below the minimum threshold. As a second example, it may be configured to go true for all cycles in which any portion of the monitor signal drops below the minimum threshold. If one or both of the sense signals of FIG. 4C rise to exceed the maximum threshold $THLD_{max}$, the third fault signal of process step 85 of FIG. 3 is generated in a manner similar to that just described for the second fault signal.

Therefore, the monitor signal $A_1 \sin \theta \sin \phi + A_2 \cos \theta \cos \phi$ detects any excursion of $A_1$ or $A_2$ above or below predetermined thresholds. The sense signals $A_1 \sin \theta$ and $A_2 \cos \theta$ are time domain signals but can also be represented as a vector 101 that travels with an angle $\theta$ in the x-y plane 100 of FIG. 5A wherein $x=A_2 \cos \theta$ and $y=A_1 \sin \theta$. For a nominal condition in which $A_1=A_2=A_{nom}$, the vector 101 describes a circular locus 102 with a radius $A_{nom}$. Maximum and minimum thresholds are represented by circles 104 and 105 with respective radii of $THLD_{max}$ and $THLD_{min}$.

Figure 5B:
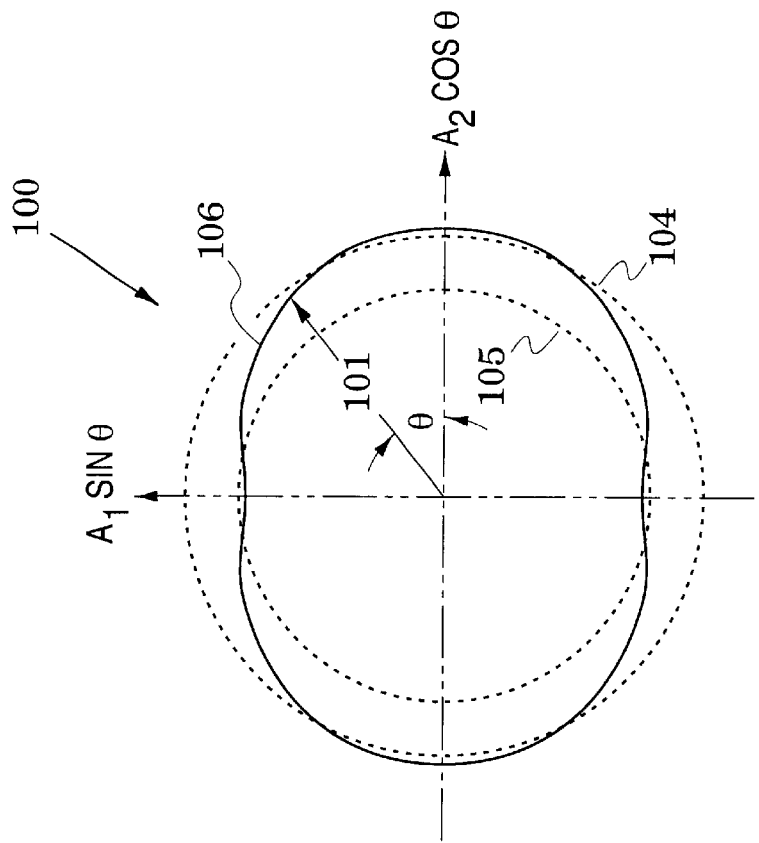
FIGS. 5A and 5B are vector representations of sense signals in the resolver system of FIG. 2.
Figure 5A:
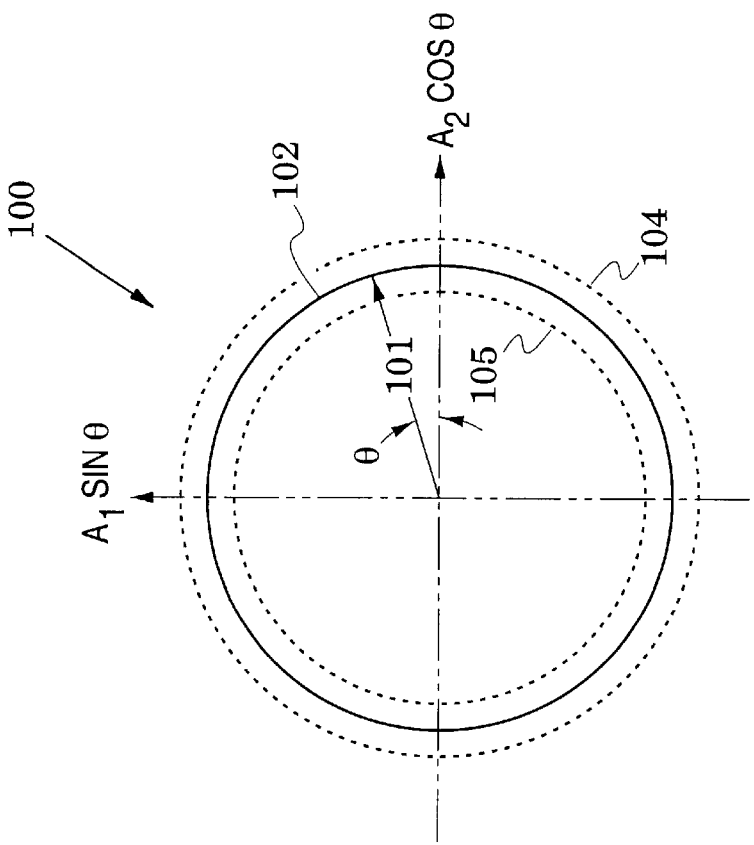

FIG. 5B is similar to FIG. 5A but illustrates a locus 106 of the vector 101 when $A_1$ has decreased below $THLD_{min}$ and $A_2$ has increased above $THLD_{max}$. As shown in FIG. 4C, the monitor signal $A_1 \sin \theta \sin \phi + A_2 \cos \theta \cos \phi$ effectively detects these violations of predetermined thresholds by the sense signals $A_1 \sin \theta$ and $A_2 \cos \theta$. In an illustrative exemplary realization of the invention, $A_{nom}$ is substantially 1.8 volts, $THLD_{max}$ is substantially 2.15 volts, $THLD_{min}$ is substantially 1.45 volts and the $THLD_{p-p}$ (associated above with FIG. 4C) is substantially 0.2 volts It was noted above that the servo loop 66 of FIG. 2 responds to the sense signals $A_1 \sin \theta$ and $A_2 \cos \theta$ and the estimate $\phi$ by generating a tracking signal that includes a term $\sin \theta \cos \phi - \cos \theta \sin \phi$. It was further noted that this term is trigonometrically equivalent to the function $\sin(\theta - \phi)$ which is shown in FIG. 4D for small values of $\theta - \phi$. The value produced by the tracking signal is the loop error signal $S_{err}$ of the servo loop 66 of FIG. 2.

It is apparent from the graph 110 of FIG. 4D, that an upper and lower tracking threshold $THLD_{trk}$ can be established which monitors the tracking of the RDC. When the loop error signal is within these thresholds, it is assured that the servo loop (66 in FIG. 2) is tracking the angle $\theta$ of the rotatable member (30 in FIG. 2). When the loop error signal is not within these thresholds, a fourth fault signal is provided as shown in process step 86 of FIG. 3.

FIG. 6 illustrates an embodiment 120 of the fault-signal generator 70 of FIG. 2 that realizes the process steps of FIG. 3 in a manner similar to that shown in FIGS. 4A–4D. The generator includes a multiplier system 122 and a comparator system 124. In the multiplier system, a first set 126 of multipliers and an associated summer are configured to respond to the sense signals $A_1 \sin \theta$ and $A_2 \cos \theta$ and to signals $\sin \phi$ and $\cos \phi$ and generate the monitor signal $A_1 \sin \theta \sin \phi + A_2 \cos \theta \cos \phi$ (as recited in process step 82 of FIG. 3).

The multiplier system 122 also includes a first set 128 of multipliers, an associated 2's complement and an associated summer that are configured to respond to the same signals and generate the tracking signal $A_1 \sin \theta \sin \phi - A_2 \cos \theta \cos \phi$. Because the servo loop 66 of FIG. 2 also generates the tracking signal, the second set 128 may be eliminated by importing the tracking signal from the servo loop. The signals $\sin \phi$ and $\cos \phi$ may be easily generated from the estimate $\phi$ or they may also be imported from the servo loop which generates them as part of generating the tracking signal.

The comparator system 124 includes a comparator 130 that has a peak detector 131 formed with a comparator 132 and a latch 133 that are arranged to latch the upper peak of an input signal on command of a clock signal. [Another] The comparator 136 and [a] latch 137 of another peak detector 135 are arranged to latch the lower peak of the input signal on command of the clock signal. The latched signals are summed 2's complement and provided to a comparator 138 for comparison with the peak-to-peak threshold $THLD_{p-p}$ to thereby provide the first fault signal (as recited in process step 83 of FIG. 3).

The comparator system 124 includes a comparator 140 that generates the second fault signal (84 in FIG. 3) in response to the monitor signal and the maximum threshold $THLD_{max}$. It also includes a comparator 141 that generates the third fault signal (85 in FIG. 3) in response to the monitor signal and the maximum threshold $THLD_{min}$. The comparator system 124 further includes a window comparator 144 that generates the fourth fault signal (86 in FIG. 3) in response to the tracking signal and tracking thresholds $THLD_{trk}$.

The fault signals of the fault-signal generator 120 (and as recited in the process steps of FIG. 3) can be utilized in various ways for various systems that include the resolver system 20 of FIG. 2. For example, they may each be individually provided to an overall control system for enhancing the effectiveness of that system. As a second example, they may be combined to indicate different states of the resolver system. If all fault signals are absent, for example, the system is in a state wherein it is tracking the angle $\theta$ and is generating an estimate $\phi$ with a high degree of accuracy. If at least one of the first, second and third fault signals is present and the fourth fault signal is absent, the system is in a state wherein it is tracking the angle $\theta$ but is generating the estimate $\phi$ with degraded accuracy. If the fourth fault signal is present, the system is in a state wherein it is not tracking the angle $\theta$ and is thus not generating a meaningful estimate $\phi$.

Figure 7:
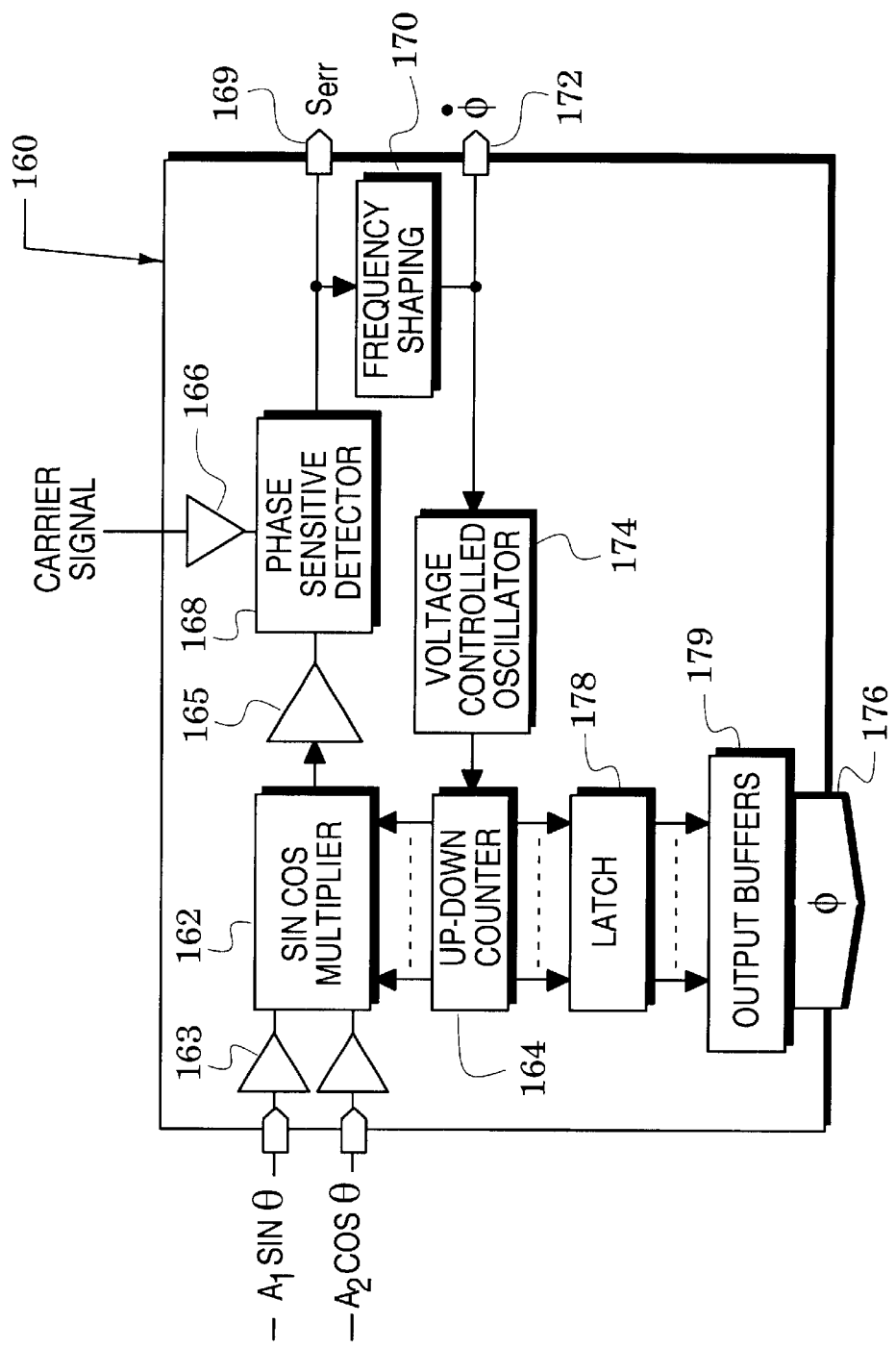
FIG. 7 is a block diagram of a mixed analog and digital embodiment of an RDC in the resolver system of FIG. 2.

FIG. 7 illustrates a mixed analog and digital embodiment 160 of the type II servo loop 66 of FIG. 2. The servo loop 160 includes a multiplier 162 that receives the sense signals $A_1 \sin \theta$ and $A_2 \cos \theta$ from buffers 163 and the estimate $\phi$ from an up-down counter 164 and that generates the loop error signal $S_{err}$. This signal is amplified in an amplifier 165 and is provided along with a sample of the carrier signal (from the generator 36 of FIG. 2 via a buffer 166) and is demodulated in a phase sensitive detector 168. The loop error signal is made available at an output port 169 and is integrated in a frequency shaping network 170 to generate the velocity which is made available at a second output port 172.

The frequency of a voltage-controlled oscillator 174 is responsive to the output of the frequency shaping network 170 and the up-down counter 164 is responsive to the output signal of the oscillator. The up-down counter performs the second integration of the type II servo loop 160. The estimate $\phi$ is provided to an output port 176 via a latch 178 and output buffers 179.

Figure 8:
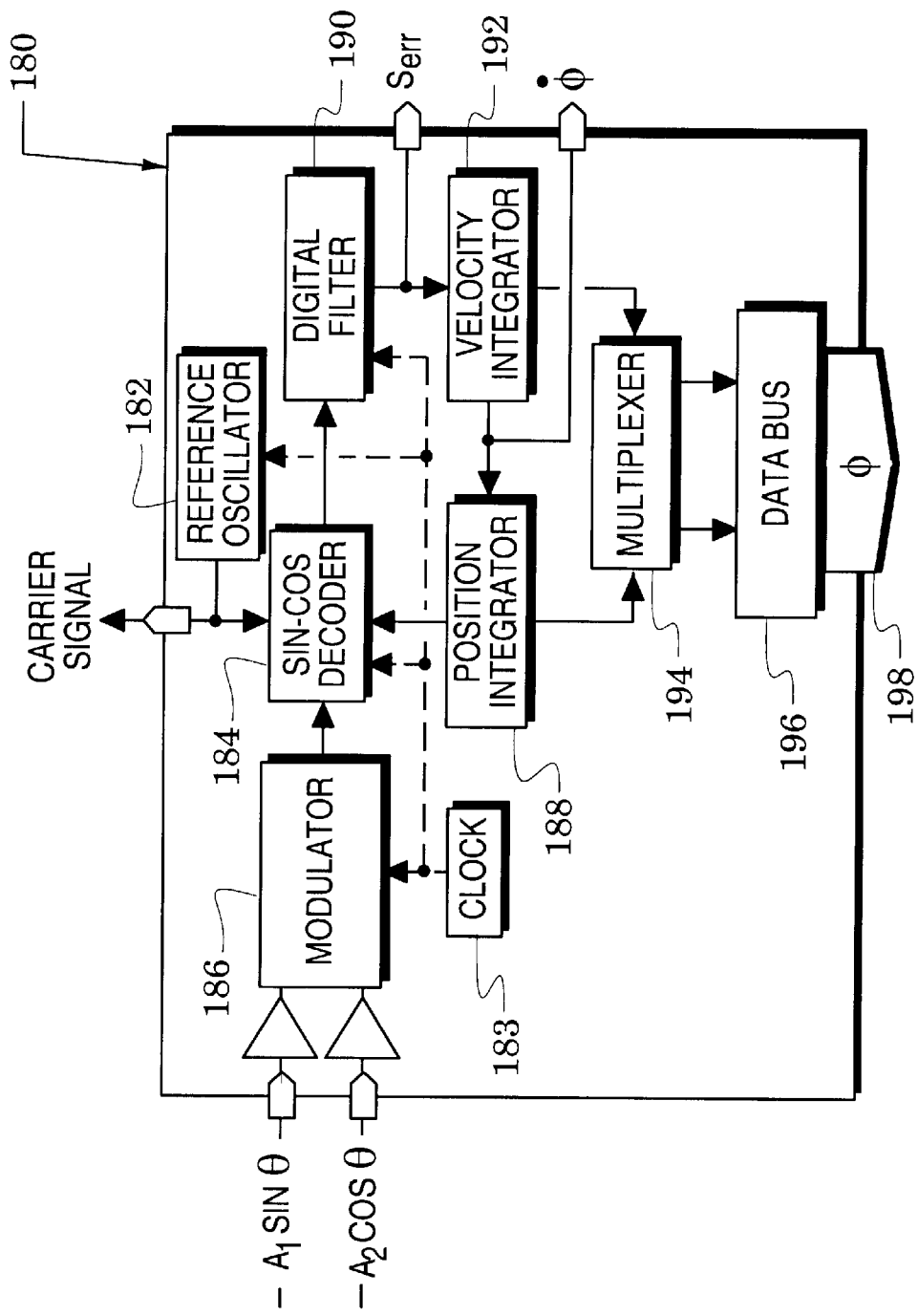
FIG. 8 is a block diagram of a digital RDC embodiment of an RDC in the resolver system of FIG. 2.

FIG. 8 illustrates a digital embodiment 180 of the type II servo loop 66 of FIG. 2. The servo loop 180 preferably includes its own reference oscillator 182 that provides the carrier signal 34 to the resolver (40 in FIG. 2) and to a sin-cos decoder 184. With timing signals from the clock 183, a modulator 186 dynamically corrects any spurious phase variations that may be induced in the sense signals as they travel from the resolver to the RDC 180. A position integrator 188 replaces the integrating functions of the voltage-controlled oscillator 174 and the up-down counter 164 of the RDC 160 of FIG. 7.

With a sample of the carrier signal from the reference oscillator 182, the sin-cos decoder 184 demodulates the sense signals. The sin-cos decoder also generates the tracking signal and derives the loop error signal $S_{err}$ which is coupled through a digital filter 190 to a velocity integrator 192. The velocity integrator performs the integration function of the frequency shaping network 170 of the RDC 160 of FIG. 7. The estimate and the velocity are coupled through a multiplexer 194 to a data bus 196 which forms the output port 198.

The fault signals of the invention are derived from a monitor signal which multiplies resolver and estimate signals to derive information on the absolute and relative levels of resolver sense signals. The invention also monitors the servo loop's error signal. Various fault signals are then derived from the monitor signal and the loop error signal which indicate, for example, mismatched sense signals, out-of-range sense signals and loss of position tracking. Simulations of the fault-signal methods of the invention have shown that they improve the sensitivity, accuracy and response time of conventional methods. The fault signals of the invention can thus be effectively used to enhance accuracy and safety in various resolver applications.

To facilitate their description, various fault signals have been given labels (e.g., first fault signal) in the above descriptions of resolver systems. These labels are descriptive only and may be interchanged in other contexts (e.g., in the claims).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of generating at least one fault signal which indicates degraded accuracy of an estimated angle $\phi$ that is generated by a servo loop in response to sense signals $A_1 \sin \theta$ and $A_2 \cos \theta$ that are generated by a resolver that senses a position angle $\theta$ of a rotatable member, wherein each of the signal amplitudes $A_1$ and $A_2$ have a nominal value $A_{nom}$, the method comprising the steps of:

generating a monitor signal of $A_1 \sin \theta \sin \phi + A_2 \cos \theta \cos \phi$;

providing a first fault signal when said monitor signal exceeds a maximum threshold $THLD_{max}$ that is greater than said nominal value $A_{nom}$; and providing a second fault signal when said monitor signal drops below a minimum threshold $THLD_{min}$ that is less than said nominal value $A_{nom}$;

said fault signals thereby indicate degraded accuracy of said estimated angle $\phi$.

2. The method of claim 1, wherein said monitor signal has a peak-to-to-peak amplitude and further including the step of providing a third fault signal when said peak-to-peak amplitude exceeds a predetermined peak-to-peak threshold $THLD_{p\text{-}p}$.

3. The method of claim 1, further including the steps of:

generating a tracking signal in said servo loop that includes a term of $\sin \theta \cos \phi - \cos \theta \sin \phi$; and providing a fourth fault signal when said tracking signal exceeds a predetermined tracking threshold $THLD_{trk}$.

4. The method of claim 1, wherein said nominal value $A_{nom}$ is substantially 1.8 volts, said upper threshold is substantially 2.15 volts, said minimum threshold is substantially 1.45 volts and said peak-to-peak threshold is substantially 0.2 volts.

5. A method of generating at least one fault signal which indicates degraded accuracy of an estimated angle $\phi$ that is generated by a servo loop in response to sense signals $A_1 \sin \theta$ and $A_2 \cos \theta$ that are generated by a resolver that senses a position angle $\theta$ of a rotatable member, wherein each of the signal amplitudes $A_1$ and $A_2$ have a nominal value $A_{nom}$, the method comprising the steps of:

generating a monitor signal of $A_1 \sin \theta \sin \phi + A_2 \cos \theta \cos \phi$ wherein said monitor signal has a peak-to-peak amplitude; and providing a first fault signal when said peak-to-peak amplitude exceeds a predetermined peak-to-peak threshold $THLD_{p\text{-}p}$;

said fault signal thereby indicates degraded accuracy of said estimated angle $\phi$.

6. The method of claim 5, further including the steps of:

providing a second fault signal when said monitor signal exceeds a maximum threshold $THLD_{max}$ that is greater than said nominal value $A_{nom}$; and providing a third fault signal when said monitor signal drops below a minimum threshold $THLD_{min}$ that is less than said nominal value $A_{nom}$.

7. The method of claim 5, further including the steps of:

generating a tracking signal in said servo loop that includes a term of $\sin \theta \cos \phi - \cos \theta \sin \phi$; and providing a fourth fault signal when said tracking signal exceeds a predetermined tracking threshold $THLD_{trk}$.

8. The method of claim 5, wherein said nominal value $A_{nom}$ is substantially 1.8 volts, said upper threshold is substantially 2.15 volts, said minimum threshold is substantially 1.45 volts and said peak-to-peak threshold is substantially 0.2 volts.

9. A resolver system that provides estimates of a position angle $\theta$ of a rotatable member in response to sense signals $A_1 \sin \theta$ and $A_2 \cos \theta$ and that monitors the accuracy of said estimates wherein each of the sense signal amplitudes $A_1$ and $A_2$ have a nominal value $A_{nom}$, said system comprising:

a resolver-to-digital converter that includes a type II servo loop which responds to said sense signals and generates an estimated angle $\phi$ that approximates said position angle $\theta$; and a fault-signal generator that is configured to generate a monitor signal of $A_1 \sin \theta \sin \phi + A_2 \cos \theta \cos \phi$ in response to said sense signals and said servo loop and provide a first fault signal when said monitor signal exceeds a maximum threshold $THLD_{max}$ that is greater than said nominal value $A_{nom}$ and a second fault signal when said monitor signal drops below a minimum threshold $THLD_{min}$ that is less than said nominal value $A_{nom}$;

said fault signals thereby indicating degradation of the accuracy of said estimated angle $\phi$.

10. The system of claim 9, wherein said servo loop generates $\sin \phi$ and $\cos \phi$ in response to said sense signals and said fault signal generator includes:

a multiplier system that generates said monitor signal in response to said sense signals and said $\sin \phi$ and said $\cos \phi$; and a comparator system that compares said monitor signal to said maximum threshold $THLD_{max}$ and said minimum threshold $THLD_{min}$.

11. The system of claim 9, wherein said fault signal generator includes a data processor that is programmed to generate said monitor signal and compare said monitor signal to said maximum threshold $THLD_{max}$ and said minimum threshold $THLD_{min}$.

12. The system of claim 9, wherein said monitor signal has a peak-to-peak amplitude and said fault signal generator is configured to provide a third fault signal in response to said peak-to-peak amplitude exceeding a predetermined peak-to-peak threshold $THLD_{p-p}$.

13. The system of claim 9, wherein said servo loop generates a tracking signal that includes a term $\sin\theta\cos\phi - \cos\theta\sin\phi$ and said fault signal generator is configured to provide a fourth fault signal when said tracking signal exceeds a predetermined tracking threshold $THLD_{trk}$.

14. The system of claim 9, further including a resolver which generates said sense signals in response to said rotatable member.

15. The system of claim 9, wherein said type II servo loop is a digital servo loop.

16. The system of claim 9, wherein said type II servo loop is a mixed analog and digital servo loop.

17. A resolver system that provides estimates of a position angle $\theta$ of a rotatable member in response to sense signals $A_1\sin\theta$ and $A_2\cos\theta$ and that monitors the accuracy of said estimates, said system comprising:
  a resolver-to-digital converter that includes a type II servo loop which responds to said sense signals and generates an estimated angle $\phi$ that approximates said position angle $\theta$; and
  a fault signal generator that is configured to respond to said sense signals and said servo loop and generate a monitor signal of $A_1\sin\theta\sin\phi + A_2\cos\theta\cos\phi$ that has a peak-to-peak amplitude and provide a first fault signal in response to said peak-to-peak amplitude exceeding a predetermined peak-to-peak threshold $THLD_{p-p}$;
  said fault signal thereby indicating degradation of the accuracy of said estimated angle $\phi$.

18. The system of claim 17, wherein said servo loop generates $\sin\phi$ and $\cos\phi$ in response to said sense signals and said fault signal generator includes:

a multiplier system that generates said monitor signal in response to said sense signals and said $\sin\phi$ and said $\cos\phi$; and
  a comparator system that compares said monitor signal to said predetermined peak-to-peak threshold $THLD_{p-p}$.

19. The system of claim 17, wherein said fault signal generator includes a data processor that is programmed to generate said monitor signal and compare said monitor signal to said predetermined peak-to-peak threshold $THLD_{p-p}$.

20. The system of claim 17, wherein:
  each of the sense signal amplitudes $A_1$ and $A_2$ have a nominal value $A_{nom}$; and
  said fault signal generator is configured to provide a second fault signal when said monitor signal exceeds a maximum threshold $THLD_{max}$ that is greater than said nominal value $A_{nom}$ and a third fault signal when said monitor signal drops below a minimum threshold $THLD_{min}$ that is less than said nominal value $A_{nom}$.

21. The system of claim 17, wherein said servo loop generates a tracking signal that includes a term $\sin\theta\cos\phi - \cos\theta\sin\phi$ and said fault signal generator is configured to provide a fourth fault signal when said tracking signal exceeds a predetermined tracking threshold $THLD_{trk}$.

22. The system of claim 17, further including a resolver which generates said sense signals in response to said rotatable member.

23. The system of claim 17, wherein said type II servo loop is a digital servo loop.

24. The system of claim 17, wherein said type II servo loop is a mixed analog and digital servo loop.

* * * * *